US011515302B2

United States Patent
Bakalski et al.

(10) Patent No.: US 11,515,302 B2
(45) Date of Patent: Nov. 29, 2022

(54) CIRCUIT INCLUDING CONFIGURATION TERMINAL AND METHOD

(71) Applicant: Infineon Technologies AG, Neubiberg (DE)

(72) Inventors: Winfried Bakalski, Putzbrunn (DE); Andreas Baenisch, Gruenwald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/879,188

(22) Filed: May 20, 2020

(65) Prior Publication Data

US 2020/0373291 A1    Nov. 26, 2020

(30) Foreign Application Priority Data

May 21, 2019 (EP) ..................................... 19175526

(51) Int. Cl.
*H01L 27/02* (2006.01)
*H05K 9/00* (2006.01)

(52) U.S. Cl.
CPC .......... *H01L 27/0255* (2013.01); *H01L 27/02* (2013.01); *H01L 27/0266* (2013.01); *H05K 9/00* (2013.01); *H05K 9/0067* (2013.01)

(58) Field of Classification Search
CPC . H01L 27/02; H01L 27/0255; H01L 27/0266; H05K 9/00; H05K 9/0067
USPC ......................................... 361/56, 91.1, 111
See application file for complete search history.

(56) References Cited

U.S. PATENT DOCUMENTS

| | | | |
|---|---|---|---|
| 6,114,878 A | 9/2000 | Loughmiller et al. | |
| 6,757,147 B1 * | 6/2004 | Tong | H01L 27/0251 361/111 |
| 7,724,023 B1 | 5/2010 | Fratti | |
| 7,978,450 B1 * | 7/2011 | Perisetty | H02H 9/046 361/118 |
| 2004/0190208 A1 | 9/2004 | Levit | |
| 2008/0316660 A1 * | 12/2008 | Huang | H02H 9/046 361/56 |
| 2009/0267678 A1 | 10/2009 | Bilger et al. | |
| 2011/0003566 A1 * | 1/2011 | Makihara | H01Q 23/00 455/127.1 |
| 2011/0063762 A1 | 3/2011 | Lee et al. | |
| 2011/0241713 A1 * | 10/2011 | Duarte De Martin | G01R 31/2884 324/755.01 |
| 2012/0057261 A1 * | 3/2012 | Poulton | H04B 3/56 361/56 |
| 2012/0081171 A1 * | 4/2012 | Tan | H03K 17/687 327/427 |
| 2015/0061753 A1 * | 3/2015 | Hino | H03K 17/6871 327/434 |
| 2016/0093579 A1 * | 3/2016 | Atesal | H01L 23/64 361/56 |
| 2018/0337170 A1 * | 11/2018 | Kanawati | H04B 1/18 |
| 2020/0091136 A1 * | 3/2020 | de Raad | H01L 27/0285 |

FOREIGN PATENT DOCUMENTS

WO    2007014270 A2    2/2007

* cited by examiner

*Primary Examiner* — Danny Nguyen
(74) *Attorney, Agent, or Firm* — Slater Matsil, LLP

(57) ABSTRACT

A circuit includes a switch coupled between a configuration terminal and an internal node. In a method of operation, the configuration terminal of the circuit is coupled to an internal node during a configuration phase and decoupled from the internal node during normal operation.

20 Claims, 3 Drawing Sheets

CIRCUIT INCLUDING CONFIGURATION TERMINAL AND METHOD

This application claims the benefit of European Patent Application No. 19175526, filed on May 21, 2019, which application is hereby incorporated herein by reference.

TECHNICAL FIELD

The present application relates to circuits including a configuration terminal and to corresponding methods.

BACKGROUND

Electronic circuits comprise terminals to communicate with other entities, for example to receive supply voltages, to receive input signals or to send output signals. In case the circuit is provided in a package, such terminals may be provided as pins of the package.

Such terminals like pins are usually protected against electrostatic discharge (ESD) by ESD protection circuits, which may be realized by diodes coupled between the respective terminals and a reference potential. In normal operation, the diodes are non-conducting. In case of an electrostatic discharge leading to a high voltage, the diodes become conducting, thus sinking the charge generated by the electrostatic discharge to the reference potential.

One kind of terminals are configuration terminals which are used to configure the circuit. For example, using such configuration terminals, operation modes for the circuit may be selected, or an address may be provided for the circuit in case a plurality of circuits is connected to a common communication environment like a bus.

To give a more specific example, for radio frequency (RF) circuits like power amplifiers, low noise amplifiers and radio frequency switches, such configuration terminals may be used to set or configure a current mode or one or more low power modes, or provide a logic address like an USID (unique slave identification) in an MIPI radio frequency frontend (RFFE). However, in some cases in normal operation the configuration terminals and associated ESD circuits may disturb the normal operation. For example, in radio interface circuit, if a pad associated with the configuration terminal is close to high amplitude radio frequency pin with high overlap capacitance to the configuration terminal the ESD circuit and readout logic associated with the configuration terminal may cause a spurious radiation of non-linear signals. This is at least in part caused by a rectification of radio frequency signals at diodes of the ESD circuit and may result in harmonics of higher order. This in turn may cause violations of radio frequency specification, and the rectified radio frequency signal also causes an increase in current consumption.

Various approaches have been made to overcome this problem which may have various drawbacks.

SUMMARY

A circuit as defined in claim 1 and a method as defined in claim 10 are provided. The dependent claims define further embodiments.

According to an embodiment, a circuit is provided, comprising:

a configuration terminal configured to receive configuration signals in a configuration phase of the circuit, an internal node coupled to internal circuitry of the circuit and a switch coupled between the configuration terminal and the internal node, wherein the switch is configured to couple the configuration terminal with the internal node during the configuration phase and to decouple the configuration terminal from the internal node during normal operation of the circuit.

According to another embodiment, a method is provided, comprising:

coupling a configuration terminal of a circuit to an internal node of a circuit during a configuration phase of the circuit and decoupling the configuration terminal from the internal node during normal operation of the circuit.

The above summary is merely intended to give a brief overview over some embodiments and is not to be construed as limiting in any way.

DETAILED DESCRIPTION OF ILLUSTRATIVE EMBODIMENTS

Figure 1A:
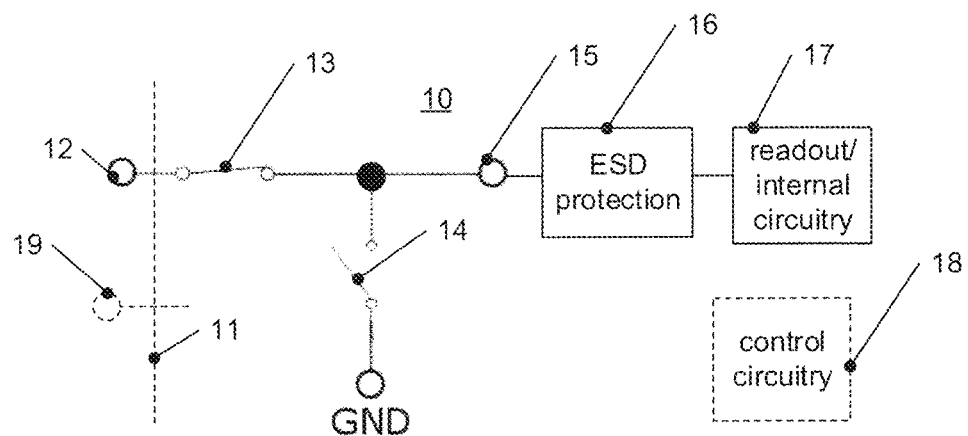
FIG. 1A is a diagram illustrating a circuit according to an embodiment in a configuration phase.

In the following, various embodiments will be described in detail referring to the attached drawings. These embodiments are to be taken as illustrative examples only and are not to be construed as limiting. For example, while embodiments may be described as comprising numerous features, in other embodiments, some of these features may be omitted or may be replaced by alternative features. In addition to the features explicitly shown in the drawings or described herein, additional features, for example features provided in conventional circuits, may be provided.

For instance, embodiments described in the following relate to the coupling and decoupling of a configuration terminal to and from other parts of a circuit, like an internal node. Apart from the coupling and decoupling described and circuitry associated therewith, in some embodiments the circuit may be implemented in a conventional manner, and may include additional terminals, additional circuit parts etc. used for providing various functions.

Variations and modifications described with respect to one of the embodiments may also be applied to other embodiments and will therefore not be described repeatedly. Features from different embodiments may be combined to form further embodiments.

Configuration, as used herein, refers to a process where a circuit is configured prior to normal operation or also in configuration phases between phases of normal operation to adjust certain functionalities. For example, values may be written to configuration registers, which then are used in normal operation. As mentioned previously, such a configuration may be used to set certain modes for the normal operation like a current mode or a low power mode or to set an address for communication via a bus. These are merely some examples, and any kind of configuration may be used. Normal operation, in contrast thereto, refers to any operation where the circuit provides the functionality it is designed for, for example functionality as a power amplifier, low noise amplifier, radio frequency switch etc.

A terminal, as used herein, is a point of contact where the circuit interfaces with the outside world, for example with other circuits. In case of integrated circuits provided in packages, such terminals may be realized as pins. Such terminals are often associated with electrostatic discharge (ESD) protection circuitry to prevent or mitigate damage to the circuit in case of an electrostatic discharge, which may for example be caused by a human being touching the circuit.

Some embodiments use switches. Switches may be implemented using one or more transistors like field effect transistors, insulated gate bipolar transistors or bipolar junction transistors. A switch is referred to as open or off when it is essentially non-conducting (apart from possible leakage currents, which may occur depending on switch implementation), and is referred to as closed or on if it provides a low ohmic electrical connection.

Figure 1B:
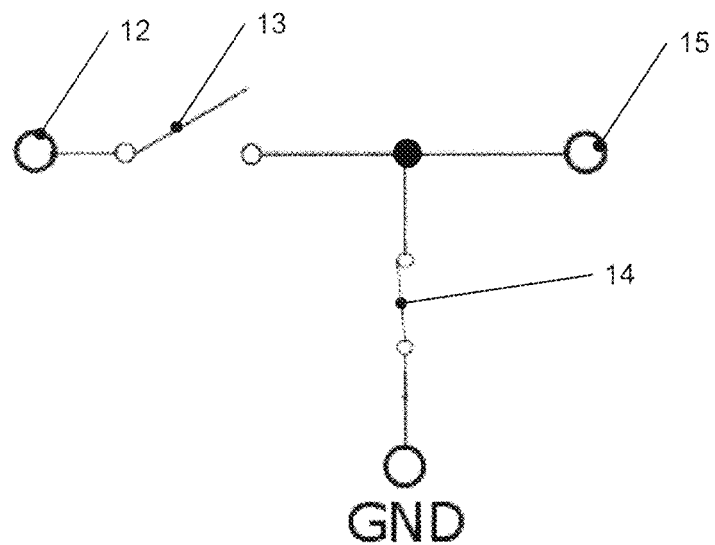
FIG. 1B is a diagram illustrating the circuit of FIG. 1A in normal operation.

FIG. 1A illustrates a circuit 10 according to an embodiment in a configuration phase, and FIG. 1B illustrates normal operation of circuit 10.

As shown in FIG. 1A, circuit 10 may be provided in a package like a chip housing indicated by a dashed line 11. A configuration terminal 12 enables a configuration of circuit 10 during a configuration phase. Configuration terminal 12 may be a configuration pin. Configuration terminal 12 is coupled to an internal node 15 via a switch 13. In the configuration phase of FIG. 1A, switch 13 is closed. Furthermore, internal node 15 is coupled to a reference potential via a switch 14. In the example of FIG. 1A, the reference potential is ground (GND). In the configuration phase illustrated in FIG. 1A, switch 14 is open, such that internal node 15 is decoupled from the reference potential.

In other embodiments, switch 14 and the coupling of internal node 15 to ground may be omitted.

Internal node 15 is coupled to ESD protection circuitry 16 and to readout circuitry/further internal circuitry 17 of circuit 10. ESD protection circuitry 16 may be implemented in any conventional manner, for example using diodes coupling internal node 15 to reference potential like ground and/or a positive reference potential, and protect circuitry 17 against electrostatic discharge on configuration terminal 12 by deviating the electrostatic discharge to the reference potential(s). Circuitry 17 reads out signals at configuration terminal 12 and configures internal circuitry of circuit 10 accordingly. This configuration may be done in any conventional manner and may be a configuration as discussed above.

In some embodiments, furthermore control circuitry 18 may be provided as part of circuit 10 to control switching of switches 13, 14, or in other words, to switch the circuit 10 between the configuration phase shown in FIG. 1A and the normal operation discussed further below with reference to FIG. 1B. In other embodiments, switches 13, 14 may be controlled by applying control signals to additional terminals, for example additional pins (not shown in FIG. 1A).

Reference numeral 19 indicates a further terminal of circuit 10, which may be a radio frequency (RF) terminal where RF signals with high signal swing may be applied. Radio frequency, in this respect, may refer to frequencies above 1 MHz, for example 100 MHz or more or in the gigahertz range. High signal swing may for example mean a signal swing of up to 14V for a 50 Ω loaded GSM (Global System for Mobile Communications) signal and up to 100V for antenna tuning applications. These values are merely examples, and in other application other values may apply.

The configuration phase of FIG. 1A may for example be applied at startup of circuit 10 to configure circuit 10 at startup.

FIG. 1B illustrates circuit 10 in a normal operation, for example after startup. In FIG. 1B, only the parts of FIG. 1A are represented where a change occurs between configuration phase and normal operation. In normal operation, switch 13 is open, and switch 14 is closed. Therefore, configuration terminal 12 is decoupled from circuit 10 (by opening switch 13), and internal node 15 and therefore switch 14 is coupled to the reference potential, for example ground, by closing switch 14.

In some embodiments, the decoupling by switch 13 reduces disturbances which may for example be caused by radio frequency signals being applied to terminals adjacent to terminal 12 like terminal 19 and may help to fulfil radio frequency specifications and may reduce current consumption. Further, by closing switch 14, remaining voltages which may be caused by and stored in parasitic capacitances of switch 13 may be shorted to ground. In the embodiment shown in FIGS. 1A and 1B switch 14 is coupled between internal node 15 and ground for discharging the remaining voltages. In other embodiments switch 14 may be coupled between terminal 12 and ground. In some implementations, the coupling as shown between internal coupled between terminal 12 and ground if a voltage is applied to terminal 12 while switch 13 is open and switch 14 is closed.

Figure 2:
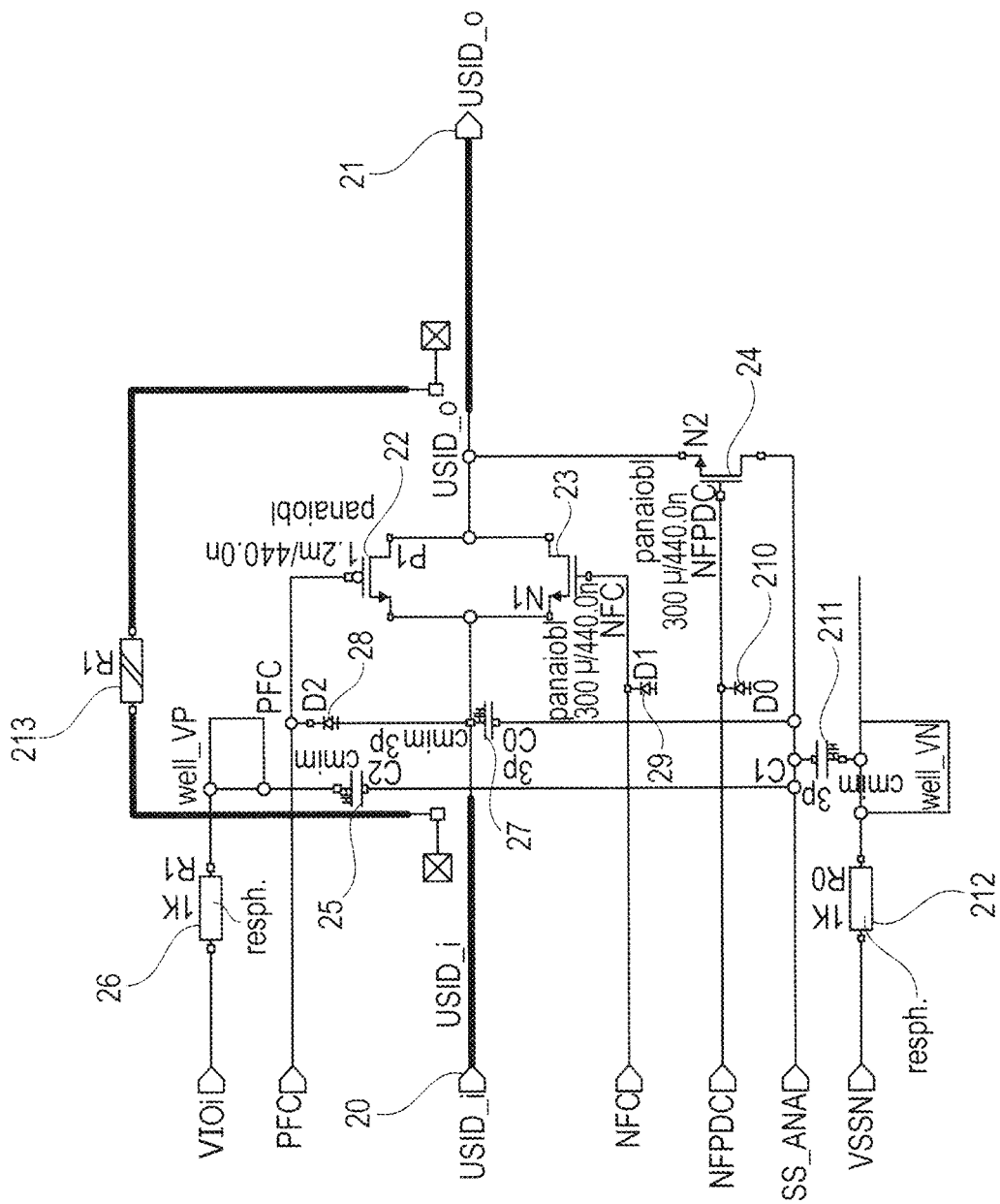
FIG. 2 is a diagram illustrating a circuit according to an embodiment.

FIG. 2 is a circuit diagram illustrating a further embodiment. In order to avoid repetitions, when describing the embodiment of FIG. 2 reference will be made to the previous description of the embodiment of FIGS. 1A and 1B.

The circuit of FIG. 2 comprises a configuration terminal 20 which is coupled to an internal node 21 via a transmission gate formed by a PMOS transistor 22 and an NMOS transistor 23. Configuration terminal 20 may be a configuration pin of a packaged circuit, as explained with reference to FIGS. 1A and 1B. Internal node 21 may be coupled to ESD protection circuitry and readout circuity and internal configuration circuits as described for internal node 15 of FIG. 1A.

PMOS transistor 22 is controlled by a signal PFC, and NMOS transistor 23 is controlled by a signal NFC. In a configuration phase, transistors 22, 23 are turned on, such that configuration terminal 20 is electrically coupled to internal node 21. Therefore, the transmission gate formed by transistors 22, 23 is an example implementation for switch 13 of FIG. 1A and serves a similar function.

Furthermore, internal node 21 is coupled to a reference potential SS_ANA (analog ground) via an NMOS transistor 24. NMOS transistor 24 is controlled by a signal NFPDC. In configuration phase, NMOS transistor 24 is turned off.

NMOS transistor 24 is an example implementation of switch 14 of FIGS. 1A and 1B.

Signals PFC, NFC and NFPDC may be generated by an internal control circuitry like control circuitry 18 of FIG. 1A, or may be supplied externally via corresponding terminals. In some embodiments, signals PFC and NFC may be generated based on a common control signal, as PMOS transistor 22 and NMOS transistor 23 are switched on and off simultaneously.

In normal operation, as has been explained with reference to FIG. 1B, transistors 22, 23 are then turned off, and NMOS transistor 24 is turned on. By turning NMOS transistor 24 on, any remaining voltage caused by parasitic capacitances of transistors 22, 23 at internal node 21 is shorted to the reference potential.

In some embodiments, such parasitic capacitances of transistors 22, 23 may be comparatively high, as for protection against electrostatic discharge (ESD). Transistors 22, 23 may have a comparatively high gate width and may use Salicide Blocking (SABL). The salicide process is a conventional process to reduce gate resistances in MOS transistors. In ESD devices this process is blocked to get a higher "pre"-resistance so that the voltage spreading gets more homogenous and avoid hot spots. Such a design allows self-conduction of transistors 22, 23 during an ESD pulse. This self-conduction limits the voltage at configuration terminal 20 and therefore the drain gate voltages of transistors 22, 23. Example gate widths may be of the order of 500 µm for NMOS transistor 23 and about 1 mm for PMOS transistor 22. It should be noted that the transistor implementations of FIG. 2 serve merely as an example, and other switches may also be used.

Additionally, in the circuit of FIG. 2, a capacitor 27 couples the configuration terminal 20 to the reference potential SS_ANA. In some embodiments, this may help to suppress radio frequency signals of very high frequency. Very high frequency may refer to frequencies in the GHz range, for example above ~3 GHz, where the shunt transistor 24 is limited by the inductance of the SS_ANA line. Using high external capacitors instead may lead to self-resonances, whereas small internal capacitors like capacitor 27 inside the chip may be more effective for avoiding self-resonances. Furthermore, in case of a triple well implementation of the transistors shown, additional RC filters comprising capacitors 25 and a resistor 26 for the PMOS transistors and a capacitor 211 and resistor 212 for the NMOS transistor for the respective wells (well_VP and well_VN in FIG. 1) may be provided. In this respect, VSSN is the negative bias voltage for the RF switch transistors 23, 24, well-VP is the RC filtered positive supply voltage and well-NP the RC filtered VSSN. Numerals 28, 29 and 210 denote diodes, and an additional terminal, e.g. RF terminal, via an element 213 is shown in FIG. 3.

Figure 3:
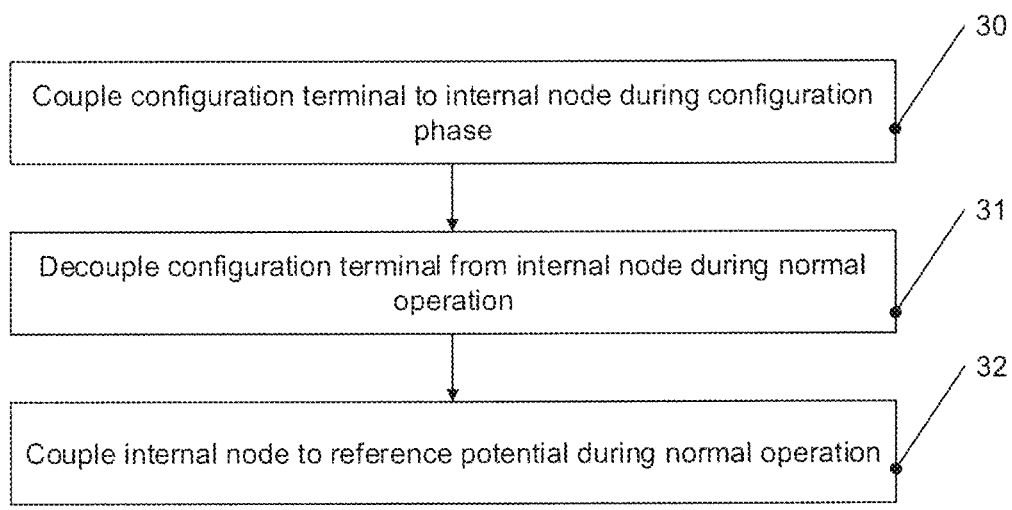
FIG. 3 is a flowchart illustrating a method according to an embodiment.

FIG. 3 is a flowchart illustrating a method according to an embodiment. The method of FIG. 3 may be implemented using the circuit of FIGS. 1A, 1B or the circuit of FIG. 2, and will be described referring thereto, but may also be implemented in other circuits.

At 30, the method comprises coupling a configuration terminal to an internal node during a configuration phase, for example startup. For example, this coupling is effected in FIGS. 1A, 1B by closing switch 13 and in FIG. 2 by turning on transistors 22, 23 of the transmission gate.

At 31, the method comprises decoupling the configuration terminal from the internal node during normal operation, for example by opening switch 13 or by turning off transistors 22, 23. Optionally, at 32, the method may further comprise coupling the internal node to a reference potential during normal operation, for example by closing switch 14 of FIGS. 1A and 1B or by turning on transistor 24 of FIG. 2 or otherwise selectively coupling a switch used at 30 and 31 like switch 13 to a reference potential. Furthermore, the method may comprise providing capacitors couplings, as explained for capacitors 27, 25 and 211 of FIG. 2.

Some embodiments are defined by the following examples:

Example 1

A circuit, comprising:
a configuration terminal configured to receive configuration signals in a configuration phase of the circuit,
an internal node coupled to internal circuitry of the circuit and
a switch coupled between the configuration terminal and the internal node, wherein the switch is configured to couple the configuration terminal with the internal node during the configuration phase and to decouple the configuration terminal from the internal node during normal operation of the circuit.

Example 2

The circuit of example 1, wherein the switch comprises a transmission gate including a PMOS transistor and an NMOS transistor.

Example 3

The circuit of example 2, further comprising an RC filter configured to couple a well of the PMOS transistor to a reference potential and/or an RC filter configured to couple a well of the NMOS transistor to the reference potential.

Example 4

The circuit of examples 1-3, further comprising a further switch, wherein the further switch is configured to couple the internal node to a reference potential during the normal mode of operation and to decouple the internal node from the reference potential in the configuration phase.

Example 5

The circuit of example 4, wherein the reference potential is ground.

Example 6

The circuit of any one of examples 1-5, further comprising ESD protection circuitry coupled to the internal node.

Example 7

The circuit of any one of examples 1-6, further comprising control circuitry configured to control the switch and/or the further switch.

Example 8

The circuit of any one of examples 1-6, further comprising further terminals configured to control the switch and/or the further switch.

Example 9

The circuit of any one of examples 1-8, further comprising a capacitor coupled between a terminal of the switch and a reference potential.

Example 10

The circuit of any one of examples 1-9, further comprising a radio frequency terminal configured to receive radio frequency signals adjacent to the configuration terminal.

Example 11

The circuit of any one of examples 1-10, wherein the circuit is provided in a package, and wherein the configuration terminal is a configuration pin of the package.

Example 12

A method, comprising:
coupling a configuration terminal to an internal node of a circuit during a configuration phase and
decoupling the configuration terminal from the internal node during normal operation.

Example 13

The method of example 12, further comprising coupling the internal node to a reference potential during normal operation, and decoupling the internal node from the reference potential during the configuration phase.

Example 14

The method of example 12 or 13, further comprising capacitively coupling the configuration terminal or the internal node to a reference potential.

Example 15

The method of any one of examples 12-14, further comprising applying a radio frequency signal to a further terminal of the circuit during normal operation.

Example 16.

The method of any one of examples 12-15, wherein ESD protection circuitry is coupled to the internal node.

Example 17.

The method of any one of examples 12-16, wherein the method is performed using the circuit of any one of examples 1-11.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit comprising:
a configuration terminal configured to receive configuration signals in a configuration phase of the circuit;
an internal node coupled to internal circuitry of the circuit;
a first switch coupled between the configuration terminal and the internal node, wherein the first switch is configured to couple the configuration terminal with the internal node during the configuration phase and to decouple the configuration terminal from the internal node during normal operation of the circuit;
a capacitor coupled between a control terminal of the first switch and a reference potential; and
a second switch directly coupled between the internal node and the reference potential, wherein the second switch is configured to couple the internal node to a reference potential during the normal mode of operation and to decouple the internal node from the reference potential in the configuration phase.

2. The circuit of claim 1, wherein the first switch comprises a transmission gate including a PMOS transistor and an NMOS transistor.

3. The circuit of claim 2, further comprising an RC filter configured to couple a well of the PMOS transistor to a reference potential and/or an RC filter configured to couple a well of the NMOS transistor to the reference potential.

4. The circuit of claim 1, further comprising ESD protection circuitry coupled to the internal node.

5. The circuit of claim 1, further comprising control circuitry configured to control the first switch and/or the second switch.

6. The circuit of claim 1, further comprising further terminals configured to control the first switch and/or the second switch.

7. The circuit of claim 1, further comprising a radio frequency terminal configured to receive radio frequency signals adjacent to the configuration terminal.

8. The circuit of claim 1, wherein the capacitor comprises an integrated circuit capacitor.

9. A method, comprising:
coupling a configuration terminal to an internal node of a circuit during a configuration phase;
decoupling the configuration terminal from the internal node during normal operation; and
capacitively coupling the configuration terminal or the internal node to a reference potential,
wherein the method is performed using a circuit comprising a first switch coupled between the configuration terminal and the internal node, and a second switch directly coupled between the internal node and the reference potential.

10. The method of claim 9, further comprising coupling the internal node to a reference potential during normal operation, and decoupling the internal node from the reference potential during the configuration phase.

11. The method of claim 9, further comprising applying a radio frequency signal to a further terminal of the circuit during normal operation.

12. The method of claim 9, further comprising coupling ESD protection circuitry to the internal node.

13. The method of claim 9, wherein capacitively coupling the configuration terminal or the internal node to a reference potential comprises capacitively coupling the configuration terminal or the internal node to the reference potential with an integrated circuit capacitor.

14. A circuit comprising:
a configuration terminal;
an internal node coupled to internal circuitry of the circuit;
a first switch having a current path and a first control node configured for receiving an externally generated first control signal, wherein the current path is directly coupled between the configuration terminal and the internal node; and
a capacitor coupled between a control terminal of the first switch and a reference potential; and
a second switch having a current path and a second control node not directly connected to the first control node, wherein the second control node is configured for directly receiving an externally generated second control signal, and wherein the current path is directly coupled between the internal node and the reference potential.

15. The circuit of claim 14, wherein the first switch comprises a transmission gate including a PMOS transistor and an NMOS transistor.

16. The circuit of claim 15, further comprising an RC filter configured to couple a well of the PMOS transistor to a reference potential and/or an RC filter configured to couple a well of the NMOS transistor to the reference potential.

17. The circuit of claim 15, further comprising ESD protection circuitry coupled to the internal node.

18. The circuit of claim 15, further comprising control circuitry configured to control the first switch and/or the second switch.

19. The circuit of claim 14, further comprising a radio frequency terminal adjacent to the configuration terminal.

20. The circuit of claim 14, wherein the capacitor comprises an integrated circuit capacitor.

* * * * *

UNITED STATES PATENT AND TRADEMARK OFFICE
CERTIFICATE OF CORRECTION

PATENT NO. : 11,515,302 B2
APPLICATION NO. : 16/879188
DATED : November 29, 2022
INVENTOR(S) : Winfried Bakalski et al.

It is certified that error appears in the above-identified patent and that said Letters Patent is hereby corrected as shown below:

In the Claims

Claim 17, Column 9, Line 3; delete "claim 15" and insert --claim 14--.

Claim 18, Column 9, Line 5; delete "claim 15" and insert --claim 14--.

Signed and Sealed this
Third Day of January, 2023

*Katherine Kelly Vidal*

Katherine Kelly Vidal
*Director of the United States Patent and Trademark Office*